(12) United States Patent
Schulze et al.

(10) Patent No.: US 10,653,029 B2
(45) Date of Patent: May 12, 2020

(54) TOOL-LESS CONVERTIBLE KEYING SOLUTION FOR MODULAR COMPONENTS

(71) Applicant: HEWLETT PACKARD ENTERPRISE DEVELOPMENT LP, Palo Alto, CA (US)

(72) Inventors: James Jeffrey Schulze, Houston, TX (US); Keith Sauer, Spring, TX (US); Kelly K. Smith, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 22 days.

(21) Appl. No.: 15/966,147

(22) Filed: Apr. 30, 2018

(65) Prior Publication Data

US 2019/0335603 A1    Oct. 31, 2019

(51) Int. Cl.
*H05K 7/14*    (2006.01)
(52) U.S. Cl.
CPC ......... *H05K 7/1424* (2013.01); *H05K 7/1488* (2013.01)
(58) Field of Classification Search
CPC ...... H05K 5/0221; H05K 7/14; H05K 7/1425; H05K 7/1424; H05K 7/1488
See application file for complete search history.

(56) References Cited

U.S. PATENT DOCUMENTS

| | | | |
|---|---|---|---|
| 7,190,575 B1 | 3/2007 | Baik et al. | |
| 7,864,519 B2 | 1/2011 | Lin et al. | |
| 8,422,217 B2 | 4/2013 | Xia et al. | |
| 9,176,915 B2 | 11/2015 | Fu et al. | |
| 2006/0067042 A1* | 3/2006 | Salinas | H05K 7/1409 361/679.37 |
| 2010/0290186 A1* | 11/2010 | Zeng | H05K 7/20545 361/694 |
| 2015/0179229 A1 | 6/2015 | Liang | |
| 2017/0322604 A1 | 11/2017 | Chen et al. | |

* cited by examiner

*Primary Examiner* — Jinhee J Lee
*Assistant Examiner* — Ingrid D Wright
(74) *Attorney, Agent, or Firm* — Nolte Intellectual Property Law Group

(57) ABSTRACT

A convertible chassis system for receiving a plurality of storage drives includes a chassis that includes a plurality of bays for receiving the storage drives. The convertible chassis also includes a reversible key that is removably affixed to the chassis body in either a first orientation or a second orientation. Each orientation provides a different key guide within the plurality of bays that either allows the storage drives to be received into or rejected from the bays of the chassis.

19 Claims, 11 Drawing Sheets

TOOL-LESS CONVERTIBLE KEYING SOLUTION FOR MODULAR COMPONENTS

BACKGROUND

Data storage networks generally include a plurality of storage devices or drives that are contained in chassis that conveniently and tightly position the drives in either a vertical or horizontal stack, i.e., a plurality of drives positioned immediately next to each other where each drive is positioned in the same orientation. The chassis determines the orientation and number of drives in each chassis rack and further the chassis provide a framework that prevents damage to the drives during installation and removal.

The chassis may include one or more cages that may in turn include a plurality of bays each sized and configured to receive a storage drive. Some chassis may include a plurality of bays each sized and configured to receive a storage module, which may include a storage drive or, in some examples, multiple storage drives. The bays of the chassis may be designed for specific types of drives and may include safety components that prevent improper sized or types of drives from being inserted into each bay.

In some instances, these safety components of the chassis may be unchangeable or difficult to change, such as when the safety components are formed out of the chassis itself. For example, the safety components are sometimes formed integral with the chassis by pressing or otherwise extending tabs from the chassis to form stops or guides for specific types of drives to be inserted in a particular bay of the chassis. This type of safety component is effective but cannot be changed or modified without significant work to the chassis. Therefore, given that various sizes and configurations of drives are available, different chassis designs are needed to receive and hold various different types and sizes of drives.

Other types of safety components may be inserted into the chassis and/or fixed to the chassis by fasteners that require tools. These configurations require a large amount of space to implement, require tools to modify, and are often unsuitable for small drive chassis due to limited space to use tools on or near the chassis. Therefore, the design of the chassis and its related components are crucial to the interchangeability of storage drives and the resultant sizing of the chassis.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
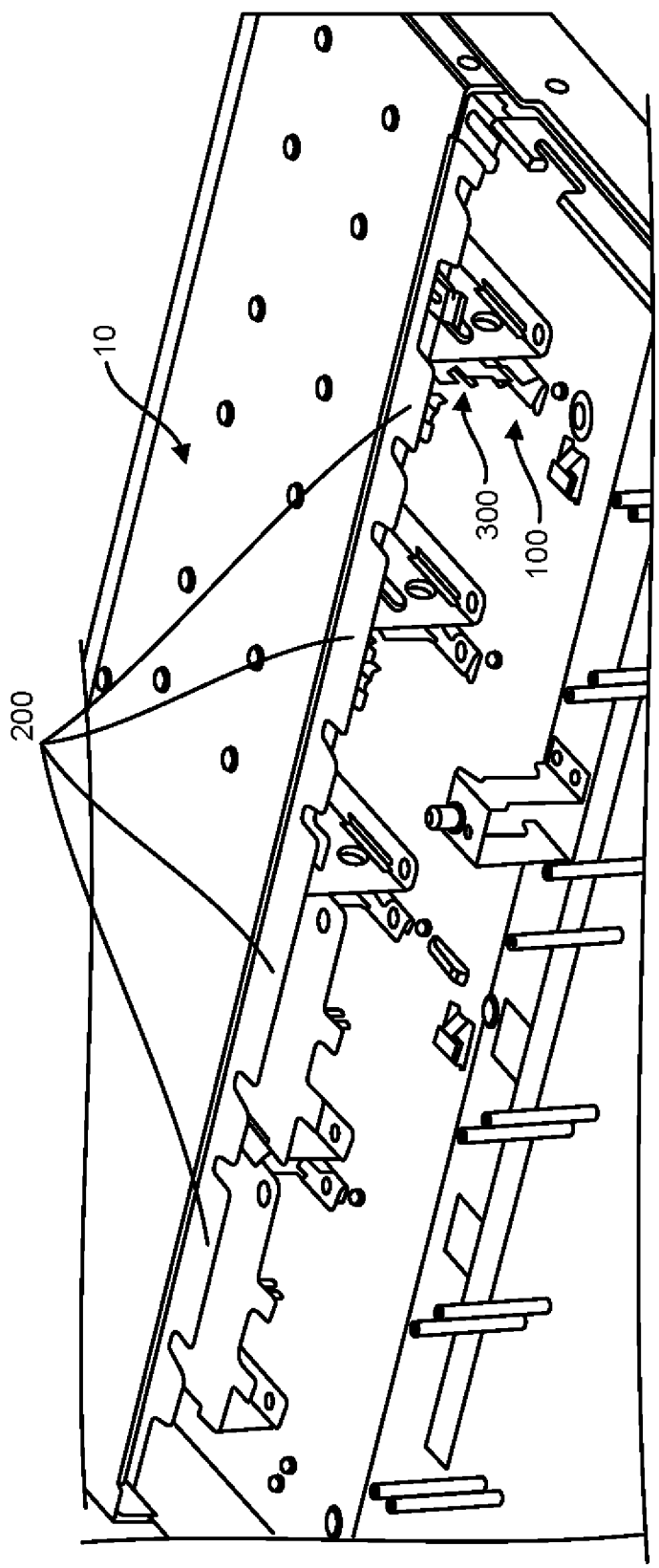
FIG. 1 is an isometric drawing of a chassis system installed in a chassis cage within a chassis according to one embodiment of the subject matter claimed below.

Illustrative embodiments of the subject matter claimed below will now be disclosed. In the interest of clarity, not all features of an actual implementation are described in this specification. It will be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

A convertible chassis system is disclosed herein that provides a tool-less safety system to prevent improper sized or types of drives from being inserted into each bay of a chassis cage. The convertible chassis system is convertible in the sense that the chassis cage may quickly and easily be converted to safely receive either a first or a second type of storage device or storage drive depending on the orientation of a reversible key that may be removably affixed to the outside of the chassis cage. In a first orientation, wherein a top side of the removable key faces a wall of the chassis cage, the chassis cage may allow the first type of storage device to be received. In the second orientation, wherein a bottom side of the removable key faces the wall of the chassis cage, the chassis cage may allow the second type of storage device to be received. The convertible chassis system is tool-less because the reversible key may be removably affixed to the chassis cage by sliding the reversible key into one or more alignment guides, wherein a key tab positioned on a spring clip may temporarily lock itself into a corresponding key hole of the chassis cage. To remove the reversible key, the spring clip may be deflected to release the removable key from keyhole and slid out of the alignment guides.

In one embodiment of the subject matter herein, a convertible chassis system for receiving a plurality of modular computing components or devices, such as storage drives, is disclosed. The modular computing components or devices may include any electronic devices usable in a computing system, such as storage drives, computing modules, server blades, etc. The description below will refer to mainly to storage drives to simplify the description, but it should be understood that in other example implementations other types of modular computing components or devices may take the place of the storage drives. The convertible chassis system may include a chassis cage that includes a body defining one or more bays for receiving the storage drives. The convertible chassis system also may include a reversible key that is removably affixed to the chassis cage body in either a first orientation or a second orientation. Each orientation provides a different key guide within the cage or bay that either allows specific storage drive to be received into or rejected from the cage or bay of the chassis.

In one embodiment, a chassis system may include a chassis cage that includes a body defining a first bay and a second adjacently positioned bay. The first and second bays may be configured to receive a storage drive. The chassis body may also include a wall that defines a first slot that is in alignment with the first bay, a second slot that is in alignment with the second bay, and a keyhole that is positioned between the first slot and the second slot. The chassis system may also include a reversible key that may be removably affixed to an outer portion of the wall of the chassis cage. The reversible key may include a key body with a top side that includes a first set of one or more key tabs and a bottom side that includes a second set of one or more key tabs. The first set of key tabs or the second set of key tabs may be receivable through the first slot, the second slot, and the keyhole of the chassis, wherein the reversible key is positioned in a first orientation when the bottom side is adjacent the outer portion of the chassis and the reversible key is positioned in a second orientation when the top side is adjacent the outer portion of the chassis.

In another embodiment a method for providing a convertible chassis system is disclosed. The method may include providing a chassis cage that defines a plurality of bays. Each bay may be configured to receive a first type of storage drive. The method may include defining a plurality of slots along a portion of the side of the chassis cage, where each slot may be aligned with a bay. The method may include positioning a reversible key with a first set of one or more key tabs on a top side of the reversible key and a second set of one or more key tabs on a bottom side of the reversible key. It may also include temporarily affixing the reversible key with the top side adjacent an external portion of the wall of the chassis such that the first set of key tabs may be received through the plurality of slots. The method may also include receiving the first type of storage drive into one or more of the plurality of bays.

In FIG. 1, an isometric drawing of an example chassis system 100 for receiving storage drives 400 (not shown) is shown. The chassis system 100 may include a chassis cages 200 and one or more reversible keys 300 that may be removably affixed to the chassis cage 200 and configured to allow the chassis cage 200 to accept different types of storage devices or drives 400 depending on the orientation of the reversible key 300, as will be further described herein. One or more chassis cages 200 with one or more reversible keys 300 may be positioned within a chassis 10.

Figure 2:
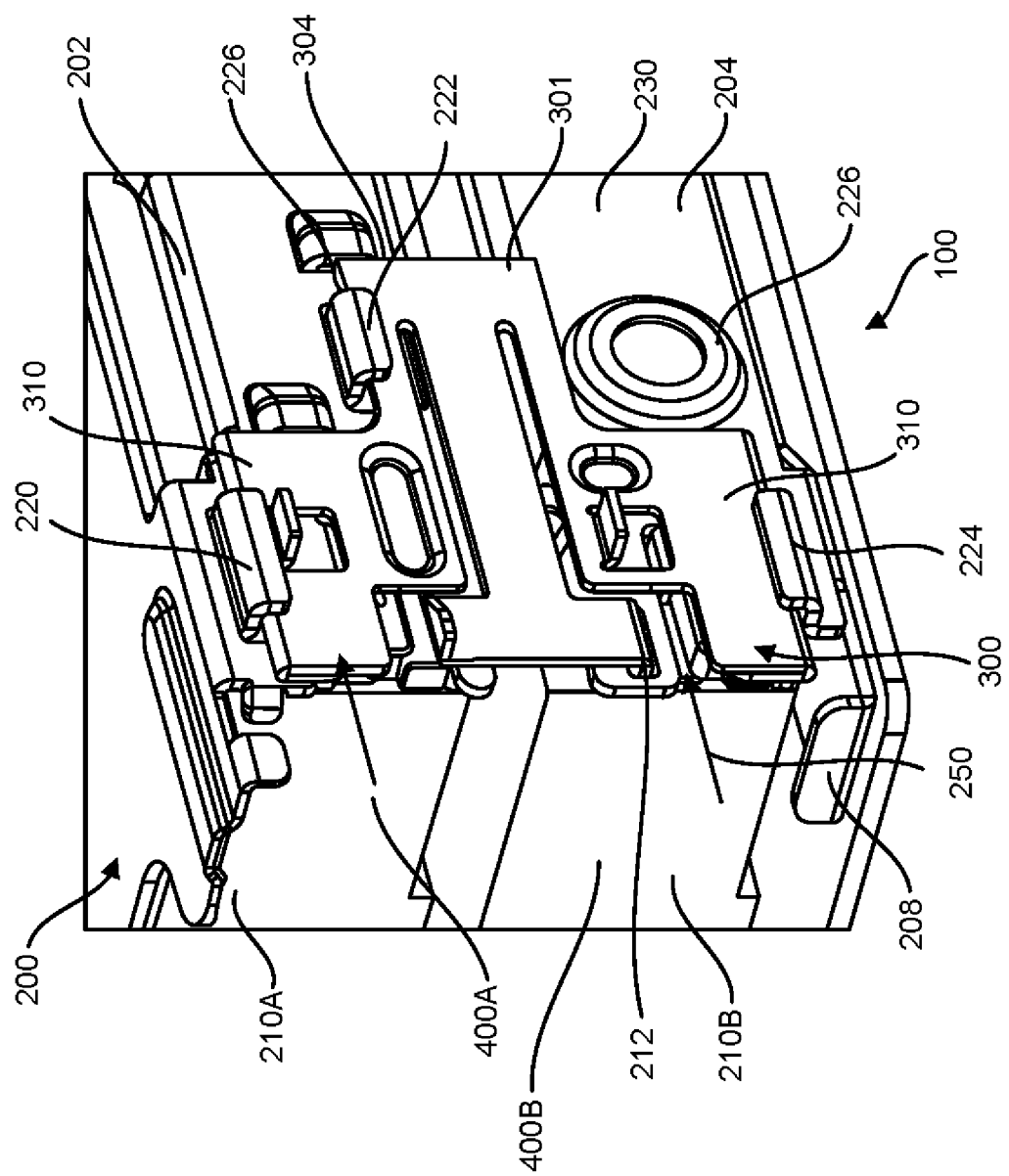
FIG. 2 is an isometric drawing of a chassis system according to one embodiment of the subject matter claimed below.
Figure 9:
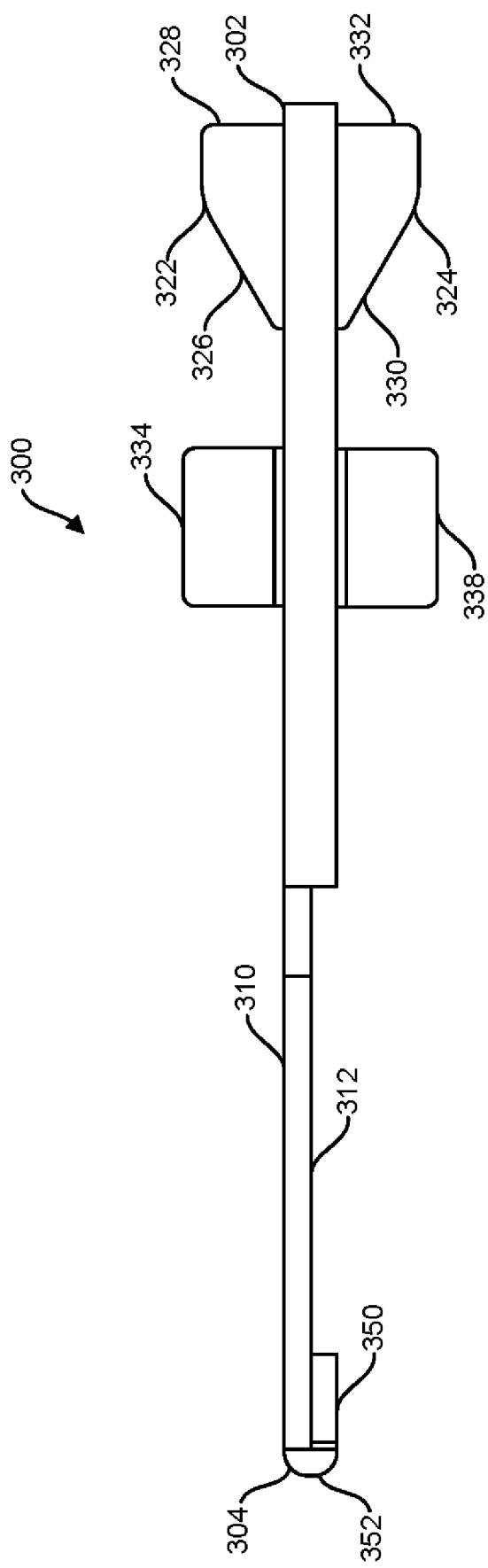
FIG. 9 is a second side view of the reversible key shown in FIG. 5.

FIG. 2 is a partial view of one chassis cage 200 with the chassis system 100 removably affixed therein. The chassis cage 200 may receive a first storage drive 400A and a second storage drive 400B, although it is contemplated that the chassis cage 200 may receive more than two storage drives 400. Storage drives 400 may include any type of storage device such as a hard disk drive ("HDD"), a solid-state drive ("SSD"), a non-volatile memory ("NVM") module, etc., and the storage drives 400 may include a variety of backplane connectors such as an Serial Attached SCSI ("SAS") type, Serial Advanced Technology Attachment ("SATA") type, or other types. In one embodiment, the storage drives 400 may include a carrier assembly 410, which is described in greater detail below in reference to FIGS. 9A and 9B.

The chassis cage 200 may include a body 202 that includes a back face 208 and one or more side walls 204 that together define a plurality of bays 210 (in FIGS. 2-3B, a first bay 210A and a second bay 210B are shown) for receiving the storage drives 400A and 400B. As used herein, a bay 210 is region within the chassis cage 200 that is designed to receive a storage drive 400 and that includes features to engage with the storage drive 400 when it is inserted into the bay 210 so as to guide and/or hold the storage drive 400 in a particular location. The side walls 204 may each be approximately ninety degrees from the back face 208. The term "approximately" is herein defined as +/−10% of a given value.

Figure 3B:
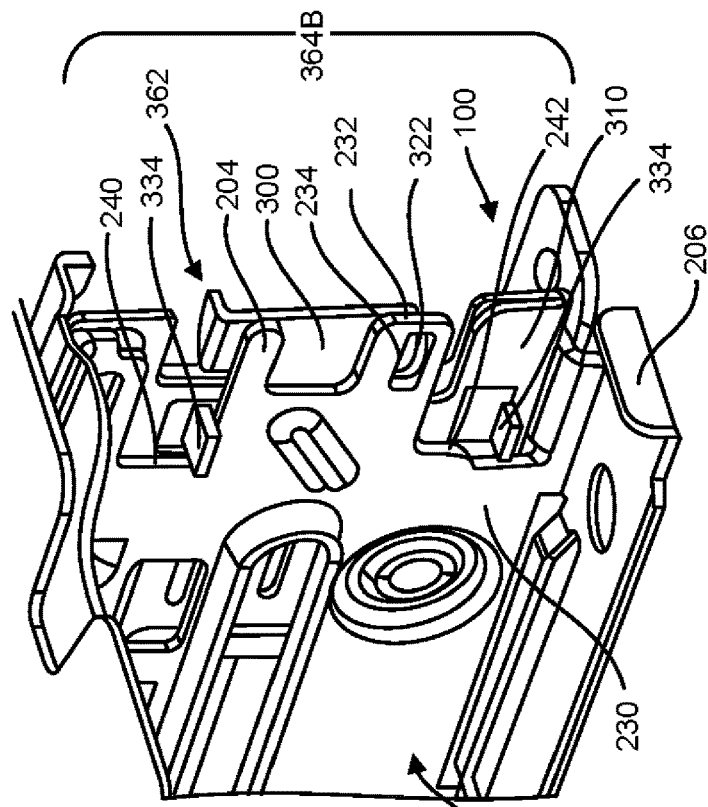
FIG. 3B is an isometric view of the chassis system of FIG. 2 in a second configuration in which a reversible key thereof is installed in a second orientation according to one embodiment of the subject matter claimed below.
Figure 3A:
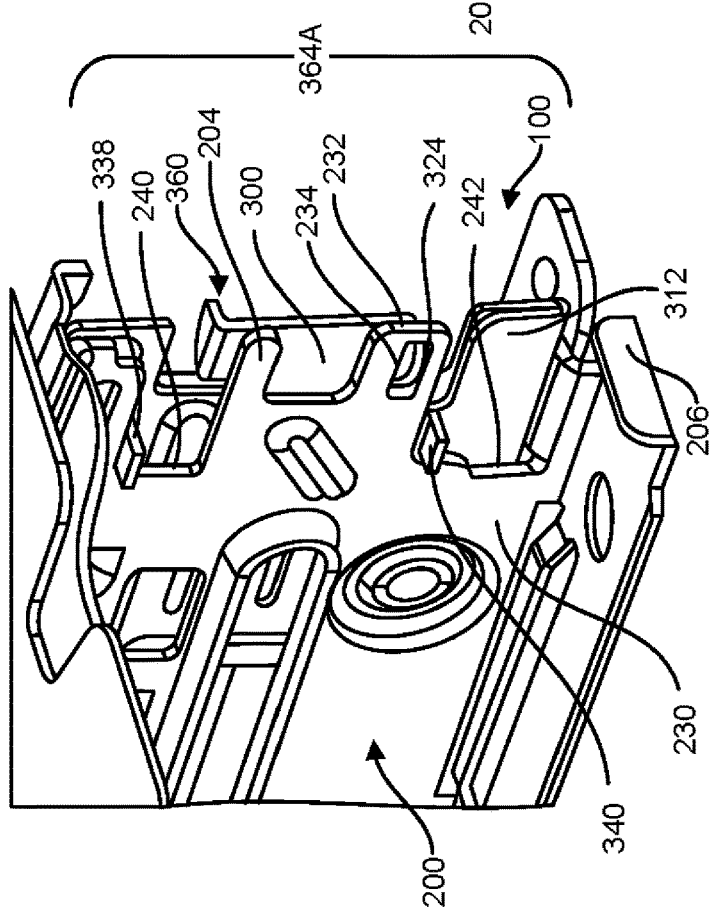
FIG. 3A is an isometric view of the chassis system of FIG. 2 in a first configuration in which a reversible key thereof is installed in a first orientation according to one embodiment of the subject matter claimed below.
Figure 4:
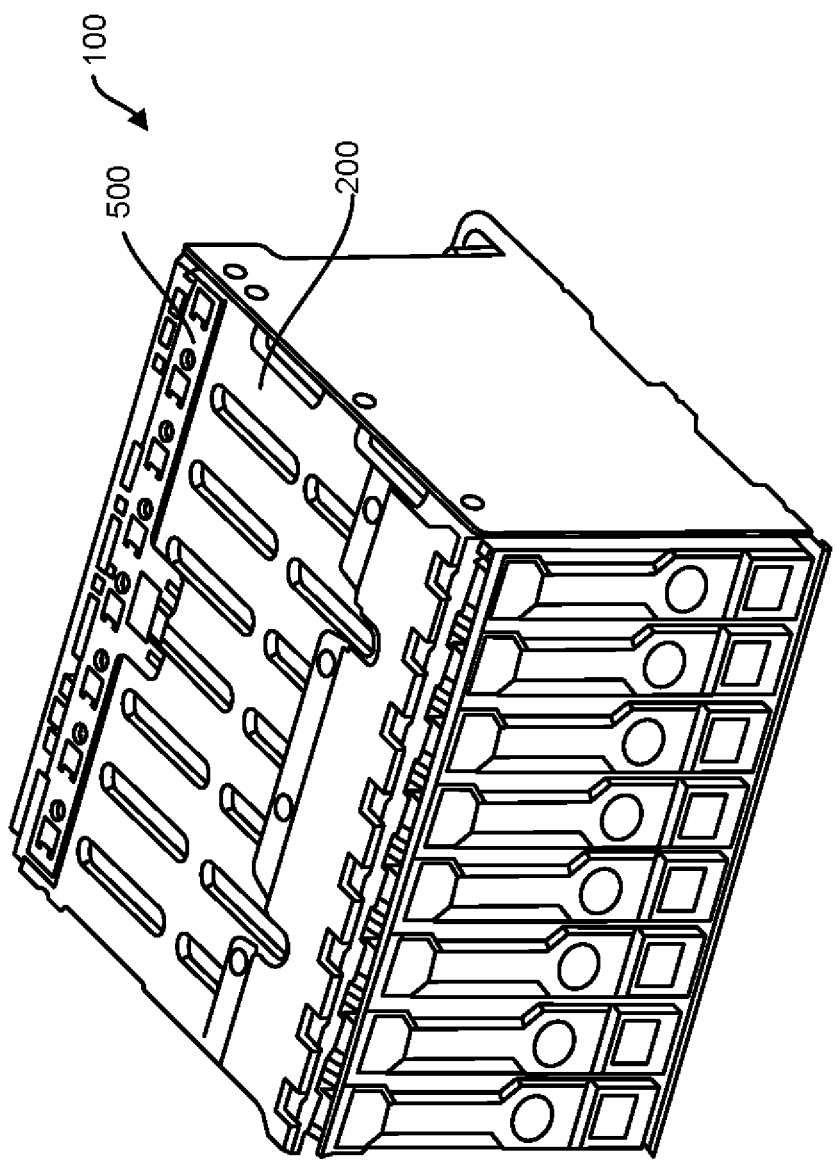
FIG. 4 is an isometric view of a chassis system according to another embodiment of the subject matter claimed below.

As shown in FIGS. 3A and 3B, the wall 204 defines a first slot 240 therethrough that is in alignment with the first bay 210A and a second slot 242 therethrough that is in alignment with the second bay 210B. In one embodiment, the first slot 240 and the second slot 242 are positioned at a back end 206 of the bay 210. The wall 204 of the chassis cage 200 may further define a keyhole 234 positioned between the first slot 240 and the second slot 242. While the chassis cage 200 illustrated in the Figures has two bays 210 and a single reversible key 300, it is contemplated that the chassis system 100 may include a chassis cage 200 with a single bay 210 or with more than two bays 210. In examples in which a chassis cage 200 includes more than two bays 210, the chassis cage 200 may include a slot for each bay (similar to the first and second slots 240/242), and a large reversible key 500 may be used that spans all bays 210 and includes key tabs for each of the bays 210 (similar to the third and fourth key tabs 334/336) as shown in FIG. 4, and as will be described further herein. Although a single chassis cage 200 is described for convenience, it should be understood that the multiple chassis cages 200 may be included in a single device enclosure (e.g., within a single server), and that the chassis cage 200 need not necessarily each include the same numbers of bays 210.

Referring to FIG. 2, the chassis cage 200 may include a plurality of alignment guides 220, 222, 224 positioned along an external side 230 of the wall 204 of the chassis cage 200. The alignment guides 220, 222, 224 may be configured to partially affix and align the reversible key 300 to the chassis cage 200. In one embodiment, the alignment guides 220, 222, 224 may be positioned at an upper portion and a lower portion of the wall 204 to hold and align two opposite ends of the reversible key 300. In one embodiment, the alignment guides 220, 222, 224 of the chassis cage 200 may be positioned so that the reversible key 300 is positioned adjacent the first bay 210A and the second bay 210B of the chassis cage 200. In one embodiment, the chassis may also include a bumper 226 positioned on the external side 230 of the wall 204 to prevent the reversible key 300 from moving past the bumper 226 on the wall 204 of the chassis cage 200.

In FIG. 2, the reversible key 300 may be positioned on the external side 230 of the wall 204 of the chassis cage 200. The reversible key 300 may include a key body 301 that includes a top side 310 and a bottom side 312 (the bottom side 312 shown in FIGS. 10A, B). The reversible key 300 may include a first orientation 360 when the bottom side 312 faces the wall 204 (FIG. 3A). The reversible key 300 may include a second orientation 362 when the reversible key 300 is flipped 180 degrees and the top side 310 faces the wall 204 (FIG. 3B). The first and the second orientations 360, 362 each provide a different key guide 364A and 364B, respectively, that either allows the storage drives 400 to be received or rejected from the bays 210A, 210B of the chassis cage 200, as will be discussed herein. In other words, guide 264A provides a different key than guide 264B.

Figure 5:
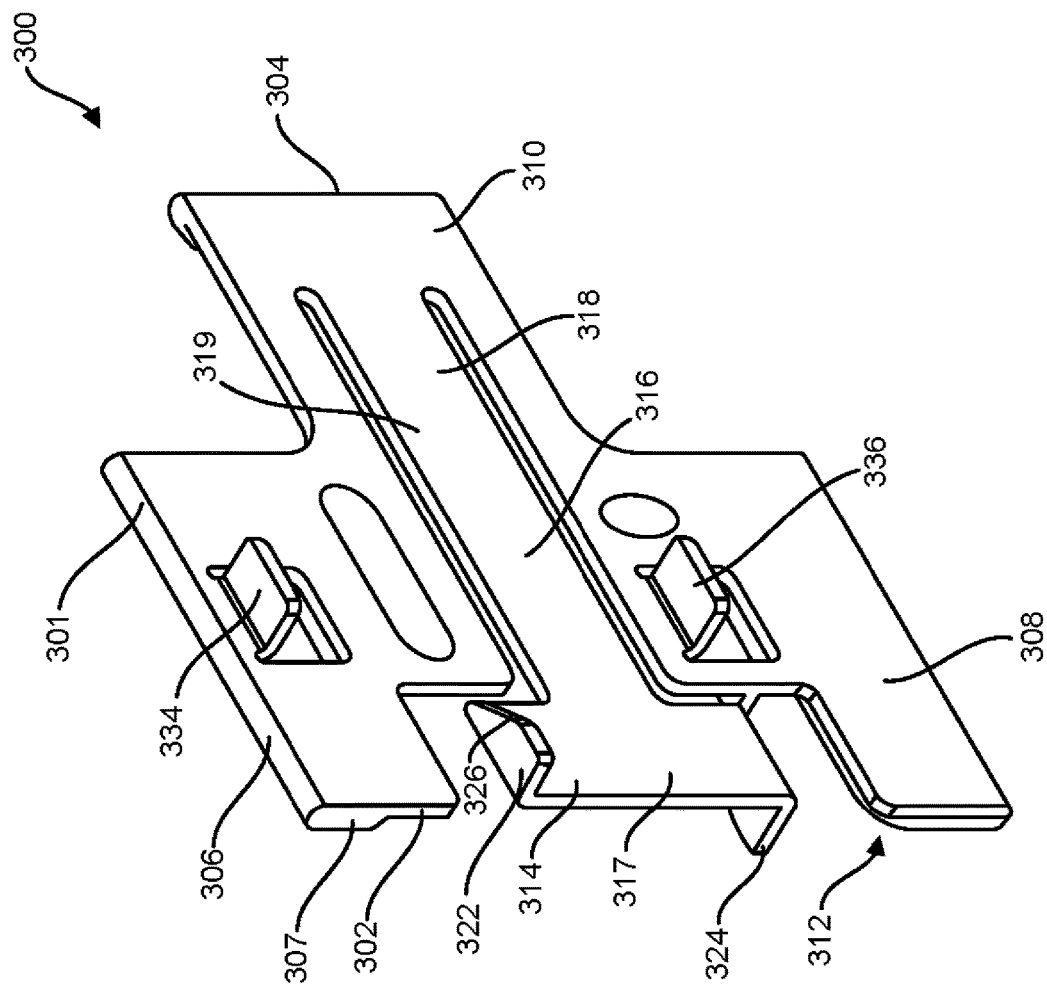
FIG. 5 is an isometric drawing of a reversible key for use in the chassis system according to one embodiment of the subject matter claimed below.

Turning to the isometric view of the reversible key 300 in FIG. 5, the key body 301 may include a first end 302 opposite a second end 304, and an upper portion 306 opposite a lower portion 308. The key body 301 may further define a spring clip 314 that extends from approximately the first end 302 of the body 301 towards the second end 304 of the body 301. The spring clip 314 may be substantially flat with a tee shape 316, where a top 317 of the tee may be positioned proximate the first end 302 of the reversible key 300 and a straight portion 318 of the tee that is perpendicular to the top 317 of the tee is positioned toward the second end 304 of the reversible key 300. The tee shape 316 of the spring clip 314 may be better seen in FIGS. 6 and 7, which show the top side 310 and the bottom side 312 of the reversible key 300, respectively. The spring clip 314 may be further positioned in a central area 319 of the reversible key body 301 between the upper portion 306 and the lower portion 308 of the reversible key 300. The spring clip 314 may deflect in a direction away from the top side 310 and the bottom side 312 of the reversible key 300.

As shown in FIG. 5, the spring clip 314 may include a first key tab 322 that orthogonally protrudes from the top side 310 of the key body 301 and a second key tab 324 that orthogonally protrudes from the bottom side 312 of the key body 301. The approximate orthogonal position of the first and second key tabs 322, 324 is more clearly illustrated in FIG. 7, which shows a first side view of the reversible key 300. The first key tab 322 and the second key tab 324 may be positioned at opposite ends of the top 317 of the tee (shown in FIG. 5). The first key tab 322 may include a ramp portion 326 that leads to a latch portion 328 and the second key tab 324 may include a ramp portion 330 that leads to a latch portion 332, which is shown in a second side view of the reversible key 300 in FIG. 8. The first key tab 322 or the second key tab 324 may be positioned within the keyhole 234 of the chassis cage 200 to removably affix the reversible key 300 to the chassis cage 200.

More specifically, the reversible key 300 may be removably affixed to the chassis cage 200 by sliding the second end 304 of the reversible key 300 in a first direction 250 into the alignment guides 220, 222, and 224 as shown in FIGS. 2, 3A, and 3B. As either the top side 310 or the bottom side 312 of the reversible key 300 slides along the external side 230 of the wall 204 of the chassis cage 200, one of the ramp portions 326 or 330 of the spring clip 314 may engage the wall 204 of the chassis cage 200 and deflect the spring clip 314 in a second direction 251, which is perpendicular to the first direction 250, until the first or the second key tab 322, 324 reach the keyhole 234 of the chassis cage 200. Once the ramp 326, 330 and the latch 328, 332 of the first or second key tab 322, 324 are aligned within the keyhole 234 of the chassis, the deflection of the spring clip 314 may be removed, which in turn positions the first or second key tab 322, 324 within the keyhole 234 such that the first or second key tab 322, 324 protrude into the chassis cage 200, as shown in FIGS. 3A and 3B. To remove the reversible key 300, the spring clip 314 may be deflected away from the wall 204 of the chassis cage 200 so that the first or second key tabs 322, 324 of the reversible are no longer protruding into the keyhole 234 of the chassis cage 200, and the reversible key may be moved in an opposite direction to the first axial direction 250. Accordingly, the reversible key 300 may be easily installed or removed from the chassis cage 200 without the need of a tool.

Referring to FIG. 5, the reversible key 300 may include a third key tab 334 that orthogonally protrudes from the top side 310 at the upper portion 306 of the key body 301 and a fourth key tab 336 that orthogonally protrudes from the top side 310 at the lower portion 308 of the key body 301. The sides of the third key tab 334 and the fourth key tab 336 may also be seen in FIGS. 8 and 9. The first key tab 322, the third key tab 334, and the fourth key tab 335, which are all positioned on the top side 310 of the key body 301, form a first set of key tabs 320. When the reversible key 300 is positioned in the second orientation 362 with the top side 310 faces the chassis cage 200 (see FIG. 3B), the first set of key tabs 320 may protrude through the wall 204 of the chassis cage 200. The third and fourth key tabs 334, 336 may protrude into each bay 210A, 210A through the first slot 240 and the second slot 242, and the first key tab 322 may protrude into the keyhole 234 forming a different key guide 364B of the second orientation 362 based on the position and spacing of the first set of key tabs 320.

Figure 7:
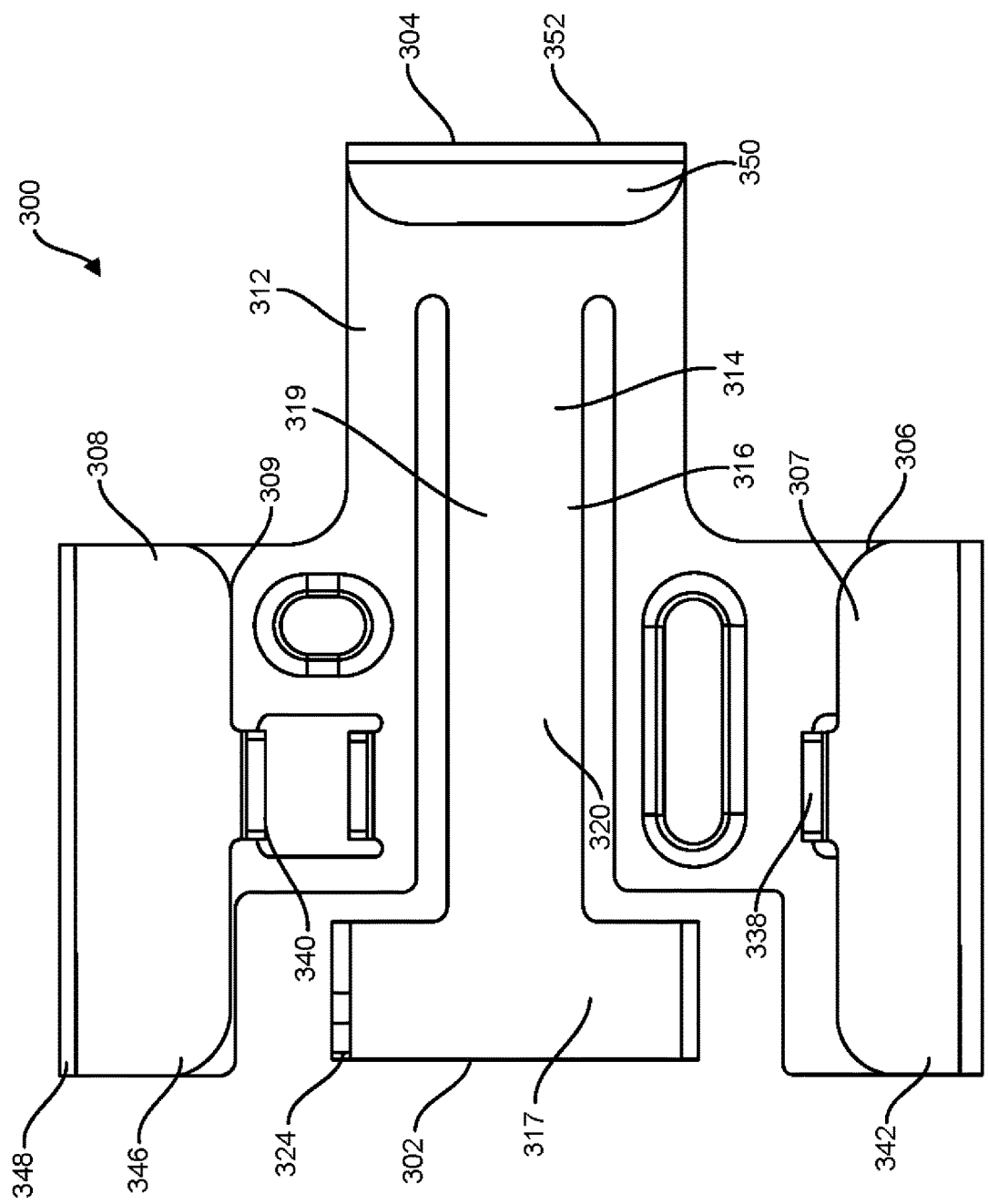
FIG. 7 is a bottom view of the reversible key shown in FIG. 5.
Figure 8:
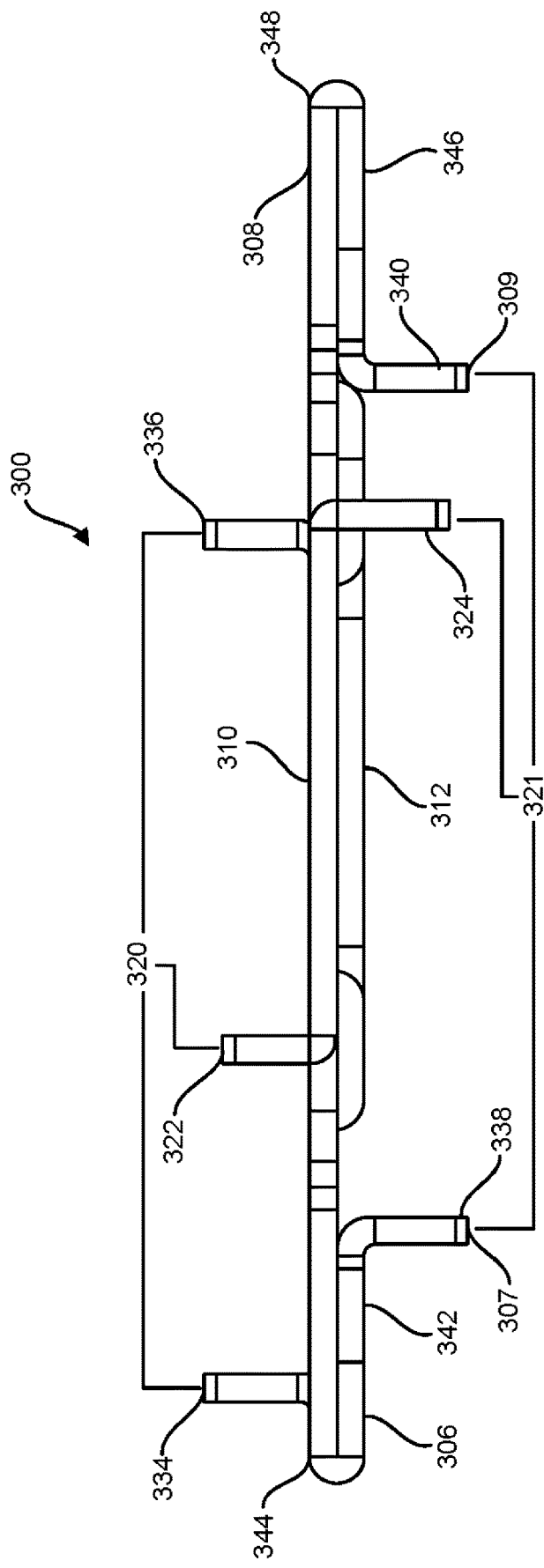
FIG. 8 is a first side view of the reversible key shown in FIG. 5.

As shown in FIGS. 7 and 8, the reversible key 300 may further include a fifth key tab 338 that orthogonally protrudes from the bottom side 312 at the upper portion 306 of the key body 301 and a sixth key tab 340 that orthogonally protrudes from the bottom side 312 at the lower portion 308 of the key body 301. The second key tab 324, the fifth key tab 338, and the sixth key tab 340, which are all positioned on the bottom side 312 of the key body 301, form a second set of key tabs 321. When the reversible key 300 is positioned in the first orientation 360 with the bottom side 312 facing the chassis cage 200 (see FIG. 3A), the second set of key tabs 321 may protrude through the wall 204 of the chassis cage 200. The fifth and the sixth key tabs 338, 340 may protrude into each bay 210A, 210B through the first slot 240 and the second slot 242, and the second key tab 324 may protrude into the keyhole 234 forming a different key guide 364A of the first orientation 360 based on the position and spacing of the second set of key tabs 321.

It is contemplated that the reversible key 300 may be made from one piece of material such as sheet metal or plastic. In one embodiment, the reversible key 300 may be made from stainless steel. To form the features of the reversible key 300, the material may be cut and/or formed as commonly known in the art. For example, a plasma cutter or a CNC machine may be used to define the features described herein. In one embodiment, the reversible key 300 could be produced by using a 3D printer.

Figure 6:
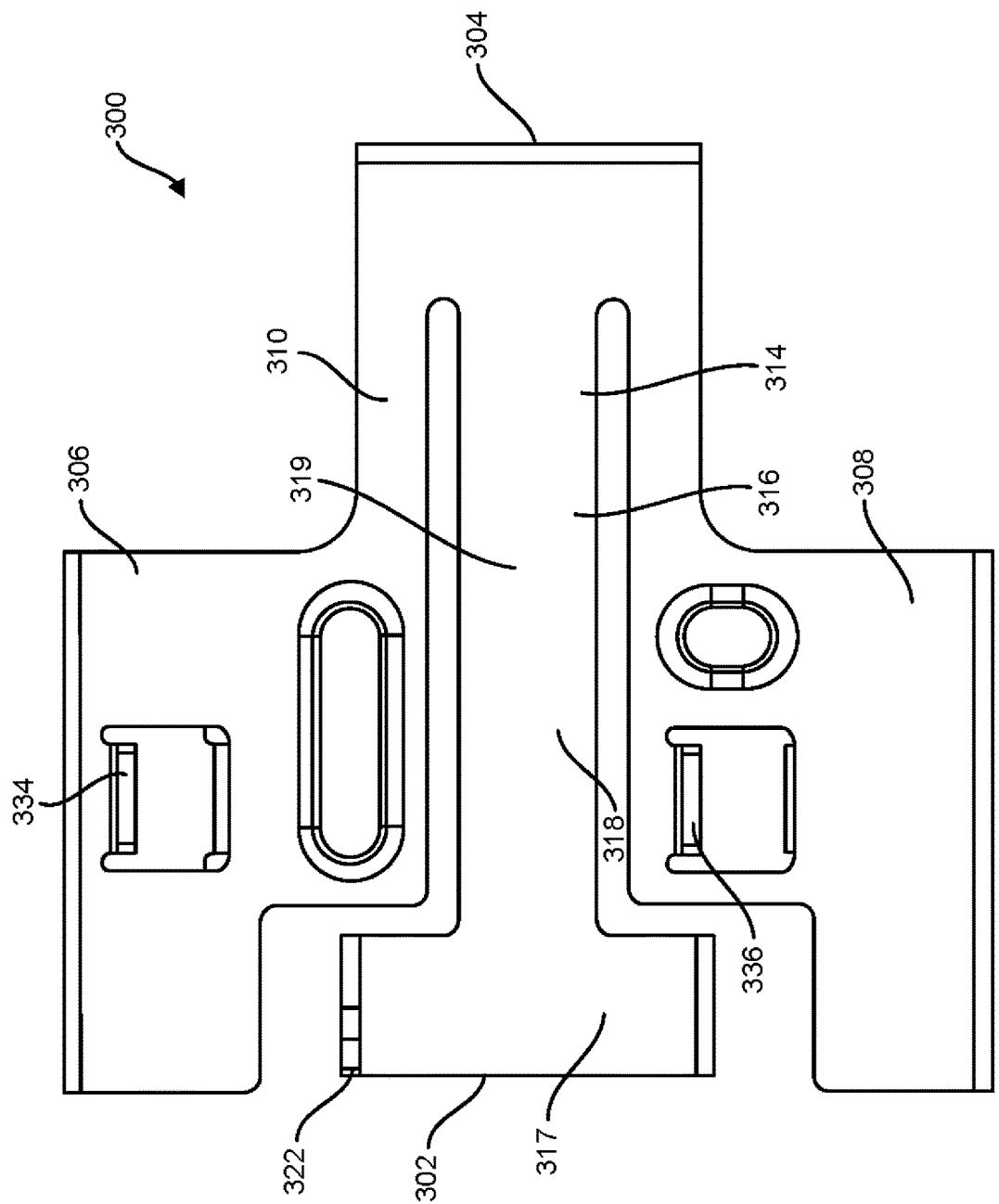
FIG. 6 is a top view of the reversible key shown in FIG. 5.

In one embodiment, and as shown in FIG. 7, a first section 342 of the upper portion 306 may be bent approximately 180 degrees along a first bend line 344 towards the bottom side 312 of the reversible key 300. The first section 342 may then form a portion of the bottom side 312. In one embodiment, the fifth key tab 338 may be formed from the first section 342. Similarly, a second section 346 of the lower portion 306 may be bent approximately 180 degrees along a second bend line 348 towards the bottom side 312 of the reversible key 300. In one embodiment the sixth key tab 340 may be formed from the second section 346. In one embodiment, the reversible key 300 may include a third section 350 at the second end 304 of the reversible key 300 that may be bent approximately 180 degrees along a third bend line 350 towards the bottom side 312 of the reversible key 300, as shown in FIGS. 6 and 8. The third section 350 may then form a portion of the bottom side 312. Accordingly, thickness of the reversible key 300 may be approximately the same at the upper portion 306, lower portion 308 and the second end 304 due to bending of the sections 342, 346, 350, respectively.

Figure 10B:
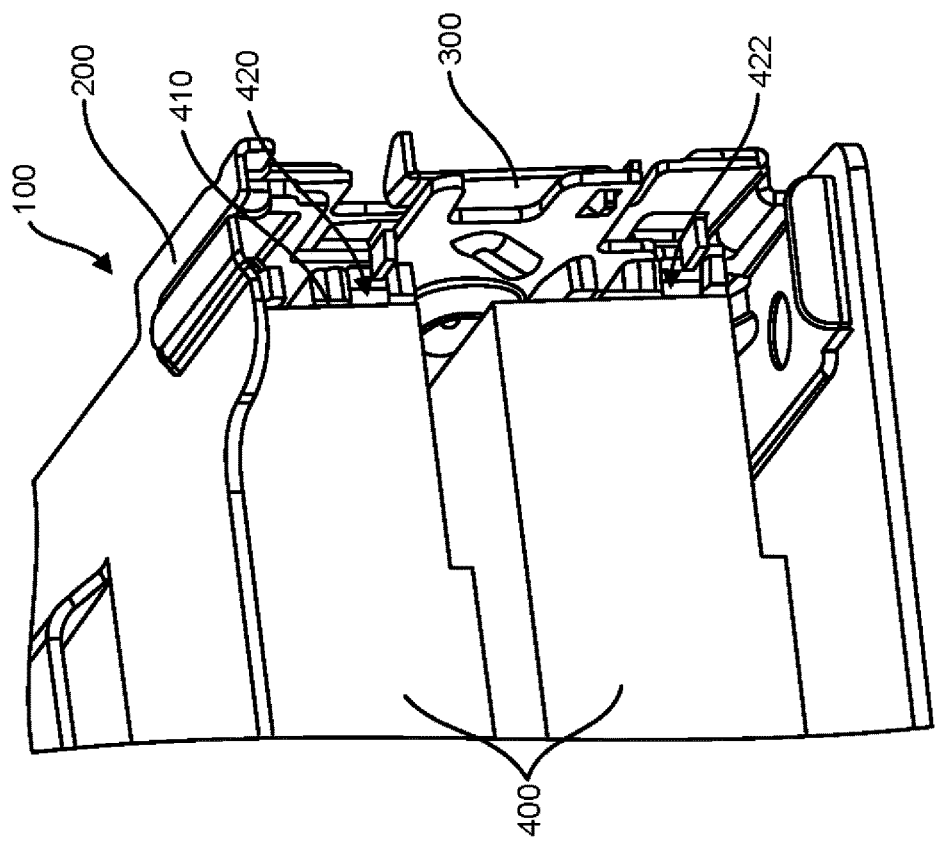
FIG. 10B is an isometric view of a chassis system with a reversible key in a position to prevent installation of a storage drive according to one embodiment of the subject matter claimed below.
Figure 10A:
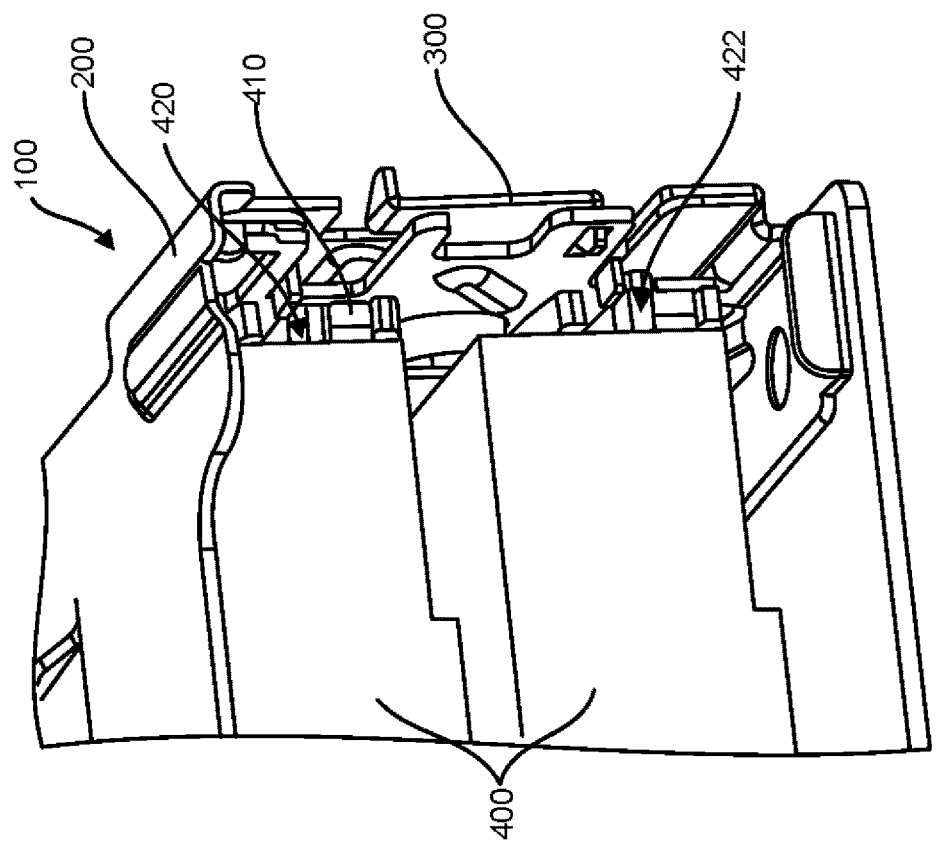
FIG. 10A is an isometric view of a chassis system with a reversible key in a position to allow installation of a storage drive according to one embodiment of the subject matter claimed below.

FIGS. 10A and 10B show isometric views of the chassis system 100 as the chassis system 100 receives a storage drive 400, according to embodiments of the subject matter herein. In one embodiment, each storage drive 400 may include a carrier assembly 410 that is based on the mating drive connector of the storage drive 400. The carrier assembly 410 may include carrier slots 420, 422 that will accept either the third and fourth key tabs 334, 336 when the reversible key 300 is in the second orientation 362 or the fifth and sixth key tabs 338, 340 when the reversible key 300 is in the first orientation 360. If the carrier slots 420, 422 accept the tabs in the first or second orientation 360, 362, the storage drive 400 may be installed into the chassis system 100, as shown in FIG. 9A. If the carrier assembly 410 does not match the first or second orientations 360, 362, the storage drive 400 will be stopped by interference with the third and the fourth key tabs 334, 336 or the fifth and the sixth key tabs 338, 340. This interference will prevent the storage drive 400 or chassis cage 200 from being damaged.

The chassis system 100 described herein allows the chassis cage 200 to accommodate multiple types of carrier assemblies 410 of storage drives 400 by changing the orientation of the reversible key 300. This tool-less keying solution saves money by not requiring multiple chassis designs for different storage drives 400 or for different carrier assemblies 410. In addition, because no tools are required to install or remove the removable keys 300 from the chassis system 100, the chassis system may include a low-profile design which may be well suited for a plurality of small storage drives that must be stacked close to one another.

Figure 11:
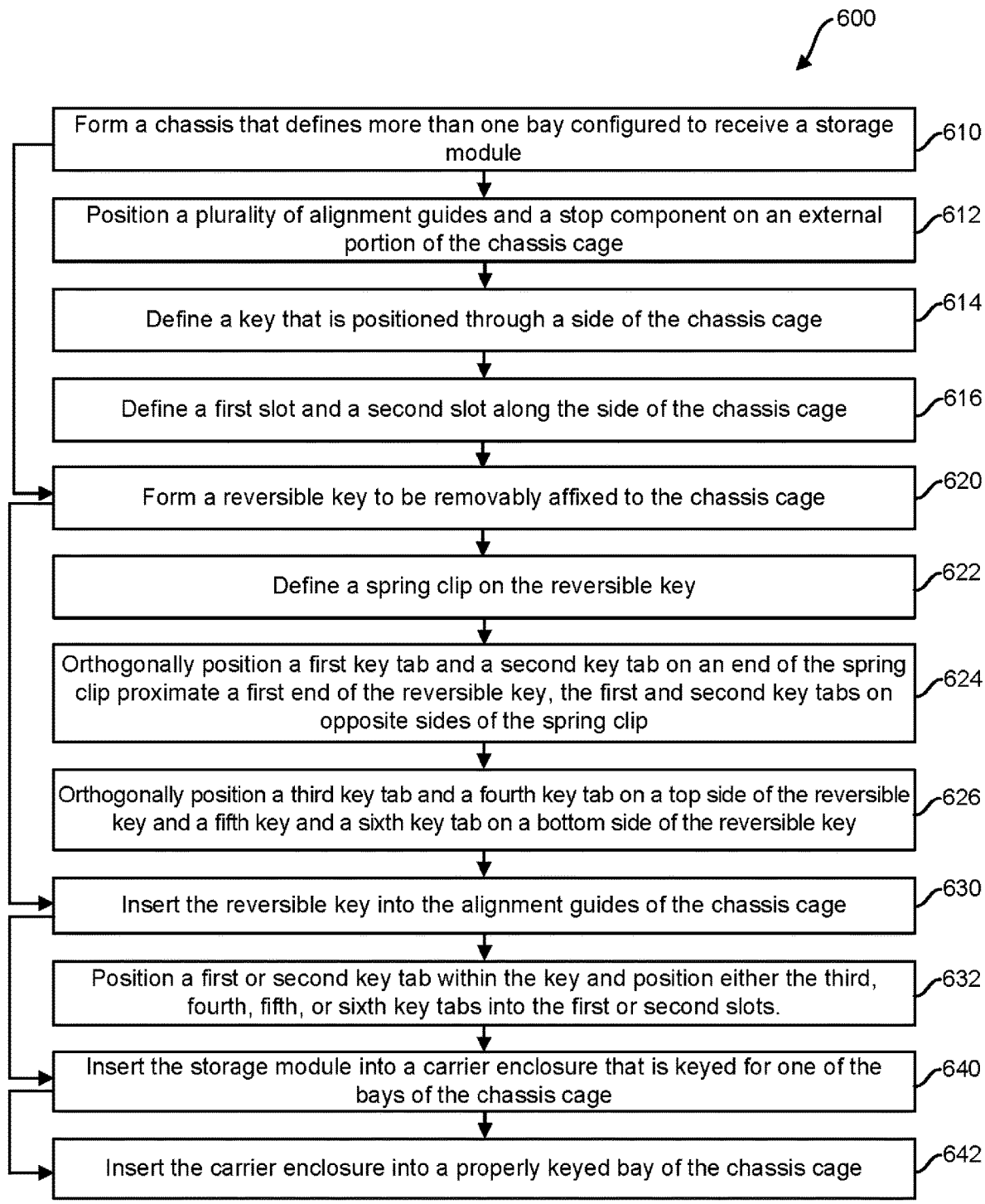
FIG. 11 is a block diagram of a method for providing a chassis system according to one embodiment of the subject matter claimed below.

A method 600 for providing a chassis system 100 to accept different types of storage drives 400 is further contemplated in accordance with the subject matter described herein, and as shown in FIG. 11. In step 610, a chassis cage 200 may be provided that defines more than one bays 210 that are configured to receive a storage drive 400. In some examples, providing the chassis cage 200 may include forming the chassis cage 200, in which case the steps 610 may include the operations illustrated in blocks 612-616 and described below. In other examples, providing the chassis cage 200 may include obtaining possession/control over an already formed chassis cage 200 that already includes the features described in blocks 612-616, in which case step 610 does not necessarily include performing the operations described in blocks 612-616. In step 612, the method may include positioning a plurality of alignment guides 220, 222, 224 on an external side 230 of the chassis cage 200 and positioning a bumper 226 on the external side 230 of the chassis cage 200. In step 614, the method may include creating a keyhole 234 that is positioned through a side of the chassis cage 200. In step 616, the method may include defining a first slot 240 and a second slot 242 along a portion of the wall 204 of the chassis cage 200.

In step 620, a reversible key 300 may be provided that can be removably affixed to the chassis cage 200. In some examples, providing the reversible key 300 may include forming the reversible key 300, in which case the steps 320 may include the operations illustrated in blocks 622-626 and described below. In other examples, providing the reversible key 300 may include obtaining possession/control over an already formed reversible key 300 that already includes the features described in blocks 622-624, in which case step 320 does not necessarily include performing the operations described in blocks 622-626. The reversible key may include a first end 302, a second end 304, an upper portion 306, a lower portion 308, a top side 310, and a bottom side 312. In step 622, a spring clip 314 may be defined on the reversible key 300 and may extend from the first end 302 towards the second end 304. In step 624, a first key tab 322 and a second key tab 324 may be orthogonally positioned on an end of the spring clip 314 proximate the first end 302 of the reversible key, with the first key tab 322 positioned on the top side 310 of the spring clip 314 and the second key tab 324 positioned on the bottom side 312 of the spring clip 314. In step 626, a third key tab 334 and a fourth key tab 336 may be orthogonally positioned on the top side 310 of the reversible key 300, the third key tab 334 positioned proximate the upper portion 306 and the fourth key tab 336 positioned proximate the lower portion 308. In step 628, a fifth key tab 338 and a sixth key tab 340 may be orthogonally positioned on the bottom side 312 of the reversible key 300, the fifth key tab 338 positioned proximate the upper portion 306 and the sixth key tab 340 positioned proximate the lower portion 308 of the reversible key 200.

In step 630, the reversible key 300 may be inserted into the alignment guides 220, 222, 224 on the external side 230 of the chassis cage 200. In step 632, the first or second key tabs 322, 324 of the reversible key 200 may be positioned within the keyhole 234 of the chassis so that either the third key tab 334 and fourth key tab 336 protrude into an internal portion 232 of the chassis cage 200 or so that the fifth key tab 338 and the sixth key tab 340 protrude into the internal portion 232 of the chassis cage 200.

In step 640, a storage drive 400 may be inserted into a carrier assembly 410 that may be keyed for one of the bays 210 in the chassis cage 200 that includes a mating connector for the storage drive 400. In step 420, the carrier assembly 410 may be inserted into the properly keyed bay 210 of the chassis system 100.

The foregoing description, for purposes of explanation, used specific nomenclature to provide a thorough understanding of the disclosure. However, it will be apparent to one skilled in the art that the systems and methods described herein can be practiced without such. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

We claim:

1. A convertible chassis system for receiving a plurality of storage drives, comprising:
   a chassis cage that includes a body defining a plurality of bays for receiving the storage drives; and
   a reversible key removably affixed to the body in a first orientation or second orientation, the reversible key being capable of being removably affixed to the chassis body in both the first and second orientations, each orientation providing a different key guide within the plurality of bays that allows the storage drives to be received into or rejected from the bays of the chassis.

2. The convertible chassis system of claim 1, wherein the reversible key may be positioned in the first orientation when a bottom side of the reversible key faces an outer portion of a wall of the body, and the reversible key may be positioned in the second orientation when a top side of the reversible key faces the outer portion of the wall the body.

3. The convertible chassis system of claim 2, wherein the reversible key includes a first set of key tabs that are orthogonal to the top side of the reversible key and a second set of key tabs that are orthogonal to the bottom side of the reversible key.

4. The convertible chassis system of claim 3, wherein the wall of the body defines through slots respectively aligned with each bay of the body, the slots configured to receive at least a portion of the first set of key tabs therethrough when the reversible key is affixed to the chassis body in the first orientation and at least a portion of the second set of key tabs therethrough when the reversible key is affixed to the body in the second orientation, the first set of key tabs or the second set of key tabs defining the different key guide for the first and the second orientation.

5. The convertible chassis system of claim 2, wherein the chassis cage includes a plurality of alignment guides positioned on the outer portion of the wall of the body that are to hold the reversible key to the wall of the chassis body in the first orientation and the second orientation.

6. The convertible chassis of claim 5, wherein the reversible key includes a spring clip that includes a first key tab that is part of the first set of key tabs and a second key tab that is part of the second set of key tabs, and wherein the wall of the chassis body defines a keyhole for receiving the first key tab and the second key tab, the first and second key tabs configured to engage with the keyhole to constrain movement of the reversible key when the reversible key is inserted into the alignment guides, thereby affixing the reversible key to the chassis.

7. A chassis system, comprising:
    a chassis cage that includes a body including a first bay and a second bay, the first and the second bays configured to receive a storage drive, the body including a wall that defines a first slot that is in alignment with the first bay, a second slot that is in alignment with the second bay, and a keyhole positioned therebetween; and
    a reversible key that is removably affixed to an outer portion of the wall of the chassis cage, the reversible key including a key body with a top side that includes a first set of key tabs and a bottom side that includes a second set of key tabs, the first set of key tabs and the second set of key tabs
    receivable through the first slot, the second slot, and the keyhole of the chassis,
    wherein the reversible key is capable of being affixed to the outer portion of the wall of the chassis cage in:
        a first orientation in which the bottom side faces the outer portion of the chassis cage, and
        a second orientation in which the top side faces the outer portion of the chassis cage.

8. The chassis system of claim 7, wherein the outer portion of the wall of the chassis cage includes one or more alignment guides that are configured to guide and align the reversible key into either the first or second orientation.

9. The chassis system of claim 8, wherein the reversible key includes a spring clip positioned between an upper portion and a lower portion of the key body and extending from a first end of the key body towards a second end of the key body, the spring clip including a first key tab that is part of the first set of key tabs and a second key tab that is part of the second set of key tabs.

10. The chassis system of claim 9, wherein the keyhole of the chassis cage receives either the first key tab or the second key tab.

11. The chassis system of claim 10, wherein the first key tab and the second key tab include a ramp portion that is configured to deflect the spring clip as the reversible key slides along the wall of the chassis cage into the alignment guides, the spring clip returning to a substantially non-deflected position when the first key tab or the second key tab is received by the keyhole of the chassis.

12. The chassis system of claim 9, wherein a third key tab that is part of the first set of key tabs is positioned on the upper portion of the key body for insertion into the first slot of the chassis cage and a fourth key tab that is part of the first set of key tabs is positioned on the lower portion of the key body for insertion into the second slot.

13. The chassis system of claim 12, wherein a fifth key tab that is part of the second set of key tabs is positioned on the upper portion of the key body for insertion into the second slot of the chassis cage and a sixth key tab that is part of the second set of key tabs is positioned on the lower portion of the key body for insertion into the first slot of the chassis cage.

14. The chassis system of claim 7, wherein the first set of key tabs is orthogonal to the top side of the reversible key and the second set of key tabs is orthogonal to the bottom side of the reversible key.

15. The chassis system of claim 7, wherein the first set of key tabs or the second set of key tabs protrude from the first slot and the second slot of the chassis, the first or the second set of key tabs each providing a different key guide that allows the storage drive to either be received or rejected into the first and second bays of the chassis.

16. A method for providing a convertible chassis system, comprising:
    providing a chassis cage that defines a plurality of bays, each bay configured to receive a storage drive, the chassis cage including a plurality of slots along a portion of a wall of the chassis cage, each slot aligned with a bay;
    providing a reversible key with a first set of key tabs on a top side of the reversible key and a second set of key tabs on a bottom side of the reversible key, the first and second sets of key tabs defining different key guides;
    removably securing the reversible key to an external portion of the wall of the chassis cage with the top side facing the wall, wherein the first set of one or more key tabs is received through the plurality of slots; and
    inserting the reversible key within an alignment guide that is positioned along the external portion of the wall of the chassis cage.

17. The method of claim 16, further including:
    positioning a key tab from the first set of one or more key tabs within a keyhole that is in the wall of the chassis cage and thereby removably affixing the reversible key to the chassis cage.

18. The method of claim 16, wherein the storage drive may be received into one or more of the plurality of bays.

19. The method of claim 18, wherein the storage drive may be inserted into a carrier assembly that is keyed to receive the first set of one or more key tabs without interference.

* * * * *